United States Patent
Ogita

(10) Patent No.: US 10,777,462 B2
(45) Date of Patent: Sep. 15, 2020

(54) SEMICONDUCTOR INTEGRATED CIRCUIT

(71) Applicant: SONY CORPORATION, Tokyo (JP)

(72) Inventor: Tomoharu Ogita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/322,320

(22) PCT Filed: Jun. 8, 2017

(86) PCT No.: PCT/JP2017/021289
§ 371 (c)(1),
(2) Date: Jan. 31, 2019

(87) PCT Pub. No.: WO2018/029965
PCT Pub. Date: Feb. 15, 2018

(65) Prior Publication Data
US 2019/0189514 A1   Jun. 20, 2019

(30) Foreign Application Priority Data

Aug. 10, 2016  (JP) .................................. 2016-157080

(51) Int. Cl.
*H01L 31/062* (2012.01)
*H01L 21/8234* (2006.01)
(Continued)

(52) U.S. Cl.
CPC ........ *H01L 21/8234* (2013.01); *H01L 27/088* (2013.01); *H01L 27/1469* (2013.01);
(Continued)

(58) Field of Classification Search
CPC ............. H01L 29/7869; H01L 27/1225; H01L 29/78696; H01L 29/24; H01L 29/78648;
(Continued)

(56) References Cited

U.S. PATENT DOCUMENTS

2004/0155313 A1   8/2004 Kawaguchi et al.
2008/0036024 A1*  2/2008 Hwang ............ H01L 27/14627
                                                         257/432
(Continued)

FOREIGN PATENT DOCUMENTS

JP    2004-235475    8/2004
JP    2011-003830    1/2011
(Continued)

OTHER PUBLICATIONS

International Search Report prepared by the Japan Patent Office dated Aug. 4, 2017, for International Application No. PCT/JP2017/021289.

*Primary Examiner* — Robert G Bachner
(74) *Attorney, Agent, or Firm* — Sheridan Ross P.C.

(57) ABSTRACT

To prevent a leakage current in a semiconductor integrated circuit in which a plurality of semiconductor substrates is laminated with a through-silicon via. Into a silicon substrate, one of P-type impurities and N-type impurities is implanted at a predetermined concentration. Into a plurality of channels, the other of the P-type impurities and the N-type impurities is implanted at a higher concentration than the predetermined concentration on one surface of the silicon substrate. An electrode is formed in each of the plurality of channels. Into a well layer, the same impurities as in the silicon substrate are implanted at a higher concentration than the predetermined concentration between the other surface of the silicon substrate and the plurality of channels.

10 Claims, 5 Drawing Sheets

(51) Int. Cl.
  *H01L 27/146* (2006.01)
  *H01L 27/088* (2006.01)
  *H04N 5/374* (2011.01)

(52) U.S. Cl.
  CPC .. *H01L 27/14634* (2013.01); *H01L 27/14645* (2013.01); *H04N 5/374* (2013.01); *H01L 27/14643* (2013.01)

(58) Field of Classification Search
  CPC ......... H01L 29/66969; H01L 27/14689; H01L 27/14612; H01L 27/14643; H01L 27/14616; H01L 29/78693; H01L 27/1255; H01L 27/14627; H04N 5/378; H04N 5/374; H04N 5/3745; H04N 5/37457; H04N 5/3698; H04N 5/23245; H04N 5/3559; H04N 5/3591; H04N 5/347; H04N 5/353; H04N 5/37452; H04N 21/442; H04N 5/2257; H04N 5/232122; H04N 5/232411; H04N 5/23254; H04N 5/2353; H04N 5/32; H04N 5/3205; H04N 5/343; H04N 5/3532; H04N 5/355; H04N 5/363; H04N 5/369; H04N 5/3696; H04N 5/372; H04N 5/3741; H04N 5/3742; H04N 5/37455; H04N 5/376; H04N 5/3765; H04N 5/379; H04N 5/455; H04N 9/045; H04N 9/07; G02F 1/1368; G02F 1/133345; G02F 1/134309; G02F 1/13439; G02F 1/136227; G02F 2201/123; G02F 1/13306; G02F 1/13338; G02F 1/1339; G02F 1/136213; G02F 1/136286; G02F 2201/121; G02F 1/1313; G02F 1/133512; G02F 1/1337; G02F 1/13454; G02F 2001/133357; G02F 2001/134372; G02F 2001/136231; G02F 2001/13685; G09G 3/20; G09G 3/2092; G09G 3/3233; G09G 3/36; G09G 3/3648; G09G 3/3677; G09G 3/3688; G09G 2300/0426; G09G 2310/0286; G09G 2330/021; G09G 2360/144; G09G 5/39; G09G 2300/0408; G09G 2300/0417; G09G 2300/0439; G09G 2300/08; G09G 2300/0809; G09G 2300/0842; G09G 2310/0221; G09G 2310/0264; G09G 2310/0267; G09G 2310/0275; G09G 2310/0289; G09G 2310/0291; G09G 2310/0294; G09G 2310/08; G09G 2320/02; G09G 2320/0276; G09G 2320/103; G09G 2330/04; G09G 2340/0407; G09G 2340/06; G09G 2360/18; G09G 3/2085; G09G 3/22; G09G 3/30; G09G 3/3208; G09G 3/3225; G09G 3/3266; G09G 3/3291; G09G 3/3659; G09G 5/14; G09G 5/393
  See application file for complete search history.

(56) References Cited

U.S. PATENT DOCUMENTS

| | | | |
|---|---|---|---|
| 2009/0050997 A1* | 2/2009 | Mutoh | H01L 27/14609 257/440 |
| 2010/0032764 A1 | 2/2010 | Andry et al. | |
| 2010/0320570 A1 | 12/2010 | Nakamura et al. | |
| 2012/0132967 A1 | 5/2012 | Andry et al. | |
| 2013/0221469 A1* | 8/2013 | Kim | H01L 27/14618 257/433 |
| 2014/0094007 A1 | 4/2014 | Andry et al. | |
| 2015/0077611 A1 | 3/2015 | Yamashita et al. | |

FOREIGN PATENT DOCUMENTS

| | | |
|---|---|---|
| JP | 2011-530812 | 12/2011 |
| JP | 2014-120609 | 6/2014 |
| JP | 2015-056878 | 3/2015 |
| JP | 2015-195235 | 11/2015 |

* cited by examiner

SEMICONDUCTOR INTEGRATED CIRCUIT

CROSS REFERENCE TO RELATED APPLICATIONS

This application is a national stage application under 35 U.S.C. 371 and claims the benefit of PCT Application No. PCT/JP2017/021289 having an international filing date of 8 Jun. 2017, which designated the United States, which PCT application claimed the benefit of Japanese Patent Application No. 2016-157080 filed 10 Aug. 2016, the entire disclosures of each of which are incorporated herein by reference.

TECHNICAL FIELD

The present technology relates to a semiconductor integrated circuit. Specifically, the technology relates to a semiconductor integrated circuit in which a plurality of semiconductor substrates is laminated.

BACKGROUND ART

Mounting technologies for laminating a plurality of semiconductor substrates to realize high density and high functionality of a large scale integration (LSI) system have been frequently used since past. For example, a solid-state image sensor in which a logic foundation having a plurality of transistors and a sensor substrate having photodiodes are laminated has been proposed (e.g., refer to Patent Literature 1). When semiconductor substrates are to be electrically connected in such a laminated-type solid-state image sensor, wire bonding or a through-silicon via (TSV) is used. Among technologies for such connection, a TSV has gained attention for the reason that substrates can be connected in a shortest distance and the semiconductor substrate can be thinner.

CITATION LIST

Patent Literature

Patent Literature 1: JP 2015-195235A.

DISCLOSURE OF INVENTION

Technical Problem

In a case in which semiconductor substrates are connected using a TSV in the above-described related art, it is necessary to polish and thin the semiconductor substrates in accordance with the length of the TSV. However, there is a problem that such polishing may cause a lattice defect in the substrates and a leakage current flows between channels of adjacent transistors via the lattice defect.

The present technology has been created taking the above circumstances into consideration and aims to prevent a leakage current in a semiconductor integrated circuit in which a plurality of semiconductor substrates is laminated with a through-silicon via.

Solution to Problem

The present technology has been made to solve the above problem, according to a first aspect thereof, a semiconductor integrated circuit includes: a silicon substrate into which one of P-type impurities and N-type impurities is implanted at a predetermined concentration; a plurality of channels into which the other of the P-type impurities and the N-type impurities is implanted at a higher concentration than the predetermined concentration on one surface of the silicon substrate; an electrode that is formed in each of the plurality of channels; and a well layer into which the same impurities as in the silicon substrate are implanted at a higher concentration than the predetermined concentration between the other surface of the silicon substrate and the plurality of channels. Accordingly, the effect of forming a depletion layer on the bonding surface of the plurality of channels and the well layer is exhibited.

In addition, according to the first aspect, the P-type impurities may be implanted into the silicon substrate, the N-type impurities may be implanted into the plurality of channels, and the P-type impurities may be implanted into the well layer. Accordingly, an effect of forming a depletion layer on the bonding surface of a P-type channel and an N-type well layer is exhibited.

In addition, according to the first aspect, the N-type impurities may be implanted into the silicon substrate, the P-type impurities may be implanted into the plurality of channels, and the N-type impurities may be implanted into the well layer. Accordingly, an effect of forming a depletion layer on the bonding surface of an N-type channel and a P-type well layer is exhibited.

In addition, according to the first aspect, the semiconductor integrated circuit may further include a through-silicon via that penetrates the silicon substrate. Accordingly, an effect of bonding the silicon substrate to another substrate is exhibited.

Advantageous Effects of Invention

According to the present technology, an excellent effect of preventing a leakage current can be exhibited in a semiconductor integrated circuit in which a plurality of semiconductor substrates is laminated. Note that the effects described herein are not necessarily limitative and may refer to any one of the effects described in this specification.

MODE(S) FOR CARRYING OUT THE INVENTION

Embodiments for implementing the present technology (which will be referred to as embodiments below) will be described below. Description will be provided in the following order.

1. First embodiment (example in which P-well layer is formed below channel)
2. Modified example

1. First Embodiment

[Example of Configuration of Solid-State Image Sensor]

Figure 1:
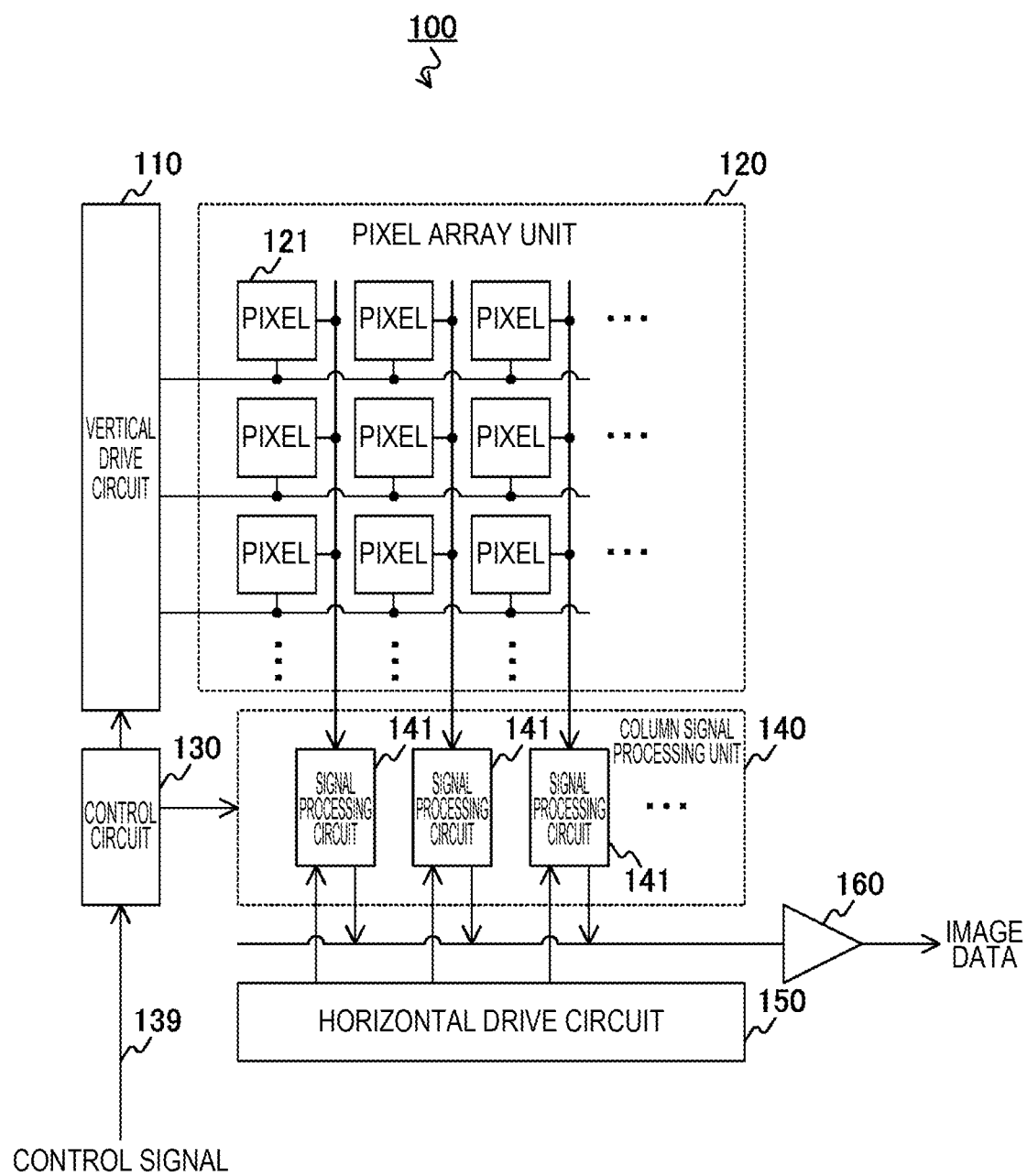
FIG. 1 is a block diagram illustrating an example of a configuration of a solid-state image sensor according to a first embodiment of the present technology.

FIG. 1 is a block diagram illustrating an example of a configuration of a solid-state image sensor 100 according to a first embodiment. The solid-state image sensor 100 includes a vertical drive circuit 110, a pixel array unit 120, a control circuit 130, a column signal processing unit 140, a horizontal drive circuit 150, and an output circuit 160. Note that the solid-state image sensor 100 is an example of the semiconductor integrated circuit described in the claims.

The pixel array unit 120 has a plurality of pixels 121 arranged in a two-dimensional lattice shape. A set of pixels 121 arrayed in a predetermined direction will be referred to as a "row" and a set of pixels 121 arrayed in the direction perpendicular to a row will be referred to as a "column" below.

The vertical drive circuit 110 sequentially drives rows and causes pixel signals to be output. The control circuit 130 controls the entire solid-state image sensor 100 in accordance with control signals input to the solid-state image sensor 100. Control signals include, for example, a vertical synchronization signal indicating a timing of imaging, and a signal for giving an instruction for an exposure amount.

Signal processing circuits 141 are provided in the column signal processing unit 140 for each of columns. The signal processing circuits 141 execute predetermined signal processing on pixel signals from corresponding columns. As signal processing, for example, an analog-to-digital (AD) conversion process and a correlated double sampling (CDS) process are executed.

The horizontal drive circuit 150 controls the signal processing circuits 141 such that pixel signals are caused to be output to the output circuit 160. The output circuit 160 outputs pixel signals from the signal processing circuits 141 to the outside of the solid-state image sensor 100.

Figure 2:
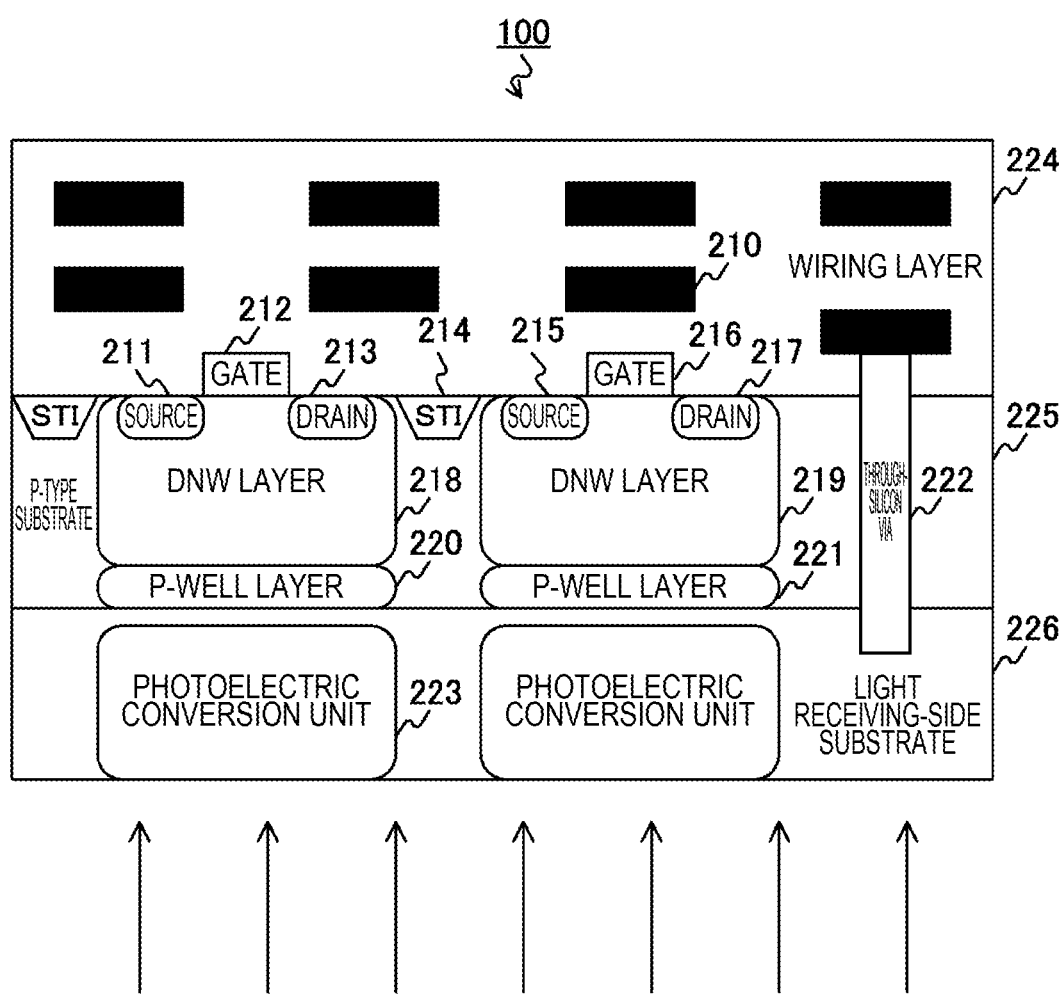
FIG. 2 is an example of a cross-sectional diagram of the solid-state image sensor according to the first embodiment of the present technology.

FIG. 2 is a block diagram illustrating an example of a configuration of the solid-state image sensor 100 according to the first embodiment. The solid-state image sensor 100 includes a light receiving-side substrate 226, a P-type substrate 225, and a wiring layer 224.

The light receiving-side substrate 226 is a substrate having one surface that is irradiated with incident light. Photoelectric conversion units 223 are formed on this light receiving surface of the light receiving-side substrate 226. In addition, color filters and micro-lenses are formed on the light receiving surface. Color filters and the like are not illustrated in FIG. 2.

The P-type substrate 225 is a substrate laminated on the surface facing the light receiving surface of the two surfaces of the light receiving-side substrate 226. P-type impurities are implanted into the P-type substrate 225 at a predetermined concentration. Note that the P-type substrate 225 is an example of the silicon substrate described in the claims.

A plurality of deep N-well (DNW) layers such as DNW layers 218 and 219 is formed on the surface of the two surfaces of the P-type substrate 225 on the wiring layer 224 side. These DNW layers are layers into which N-type impurities are implanted at a higher concentration than the concentration of the impurities of the P-type substrate 225.

In addition, a shallow trench isolation (STI) 214 for isolating elements is formed between the DNW layer 218 and the DNW layer 219. In addition, a source 211 and a drain 213 are formed in the DNW layer 218 though implantation of P-type impurities. In addition, a source 215 and a drain 217 are also formed in the DNW layer 219 though implantation of P-type impurities. Furthermore, a gate 212 is formed between the source 211 and the drain 213 and a gate 216 is formed between the source 215 and the drain 217. Note that the source 211, the gate 212, the drain 213, the source 215, the gate 216, and the drain 217 are examples of the electrode described in the claims.

All the above-described DNW layer 218, the source 211, the gate 212, and the drain 213 function as an N-type metal-oxide-semiconductor (MOS) transistor. The DNW layer 218 is used as a channel of the MOS transistor. In addition, the MOS transistor may be used as, for example, a reset transistor that initializes a charge amount or a selection transistor that selects a row. In addition, the MOS transistor may be used as an amplification transistor that amplifies pixel signals or a transfer transistor that transfers electric charge. The DNW layer 219, the source 215, the gate 216, and the drain 217 function as an MOS transistor likewise. Note that the DNW layers 218 and 219 are examples of the channels described in the claims.

A P-well layer 220 is formed between the DNW layer 218 and the surface of the P-type substrate 225 on the light receiving side, and a P-well layer 221 is also formed between the DNW layer 219 and the surface of the P-type substrate 225 on the light receiving side. The P-well layers 220 and 221 are formed by implanting P-type impurities at a higher concentration than the concentration of the impurities of the P-type substrate 225. Note that the P-well layers 220 and 221 are examples of the well layer described in the claims.

In addition, a through hole is formed in the P-type substrate 225 in the direction perpendicular to the substrate, and a through-silicon via 222 is inserted into the through hole. The light receiving-side substrate 226, the P-type substrate 225, and the wiring layer 224 are connected by the through-silicon via 222. Before the insertion of the through-silicon via 222, the surface of the P-type substrate 225 on the light receiving side is polished and thinned in accordance with the length of the through-silicon via 222.

Wiring 210 is provided in the wiring layer 224. The wiring 210 allows signals to be transmitted between the MOS transistors and the photoelectric conversion units 223. A circuit including the wiring 210, the MOS transistor, and the photoelectric conversion unit 223 functions as the pixel 121 illustrated in FIG. 1.

Figure 3:
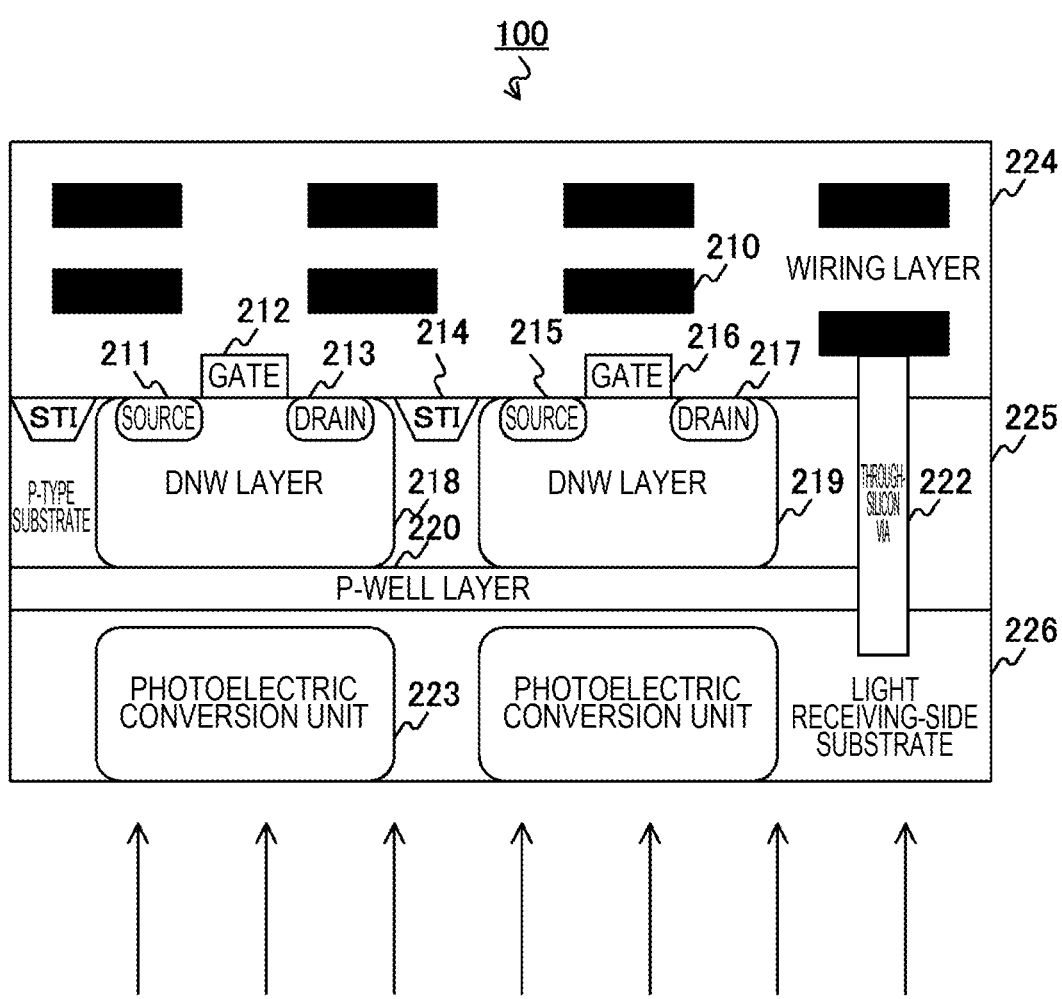
FIG. 3 is an example of a cross-sectional diagram of the solid-state image sensor with a P-well layer formed on the entire surface according to the first embodiment of the present technology.

Note that, although the P-well layers (220 and 221) are formed only below the DNW layers (218 and 219) in FIG. 2, a P-well layer may be formed on the entire surface of the P-type substrate 225 on the light receiving side as illustrated in FIG. 3.

In addition, although the P-type substrate 225 is provided in the solid-state image sensor 100, the P-type substrate 225 can be provided in a circuit other than the solid-state image sensor 100 as long as the circuit is a semiconductor integrated circuit that uses a transistor.

Figure 4:
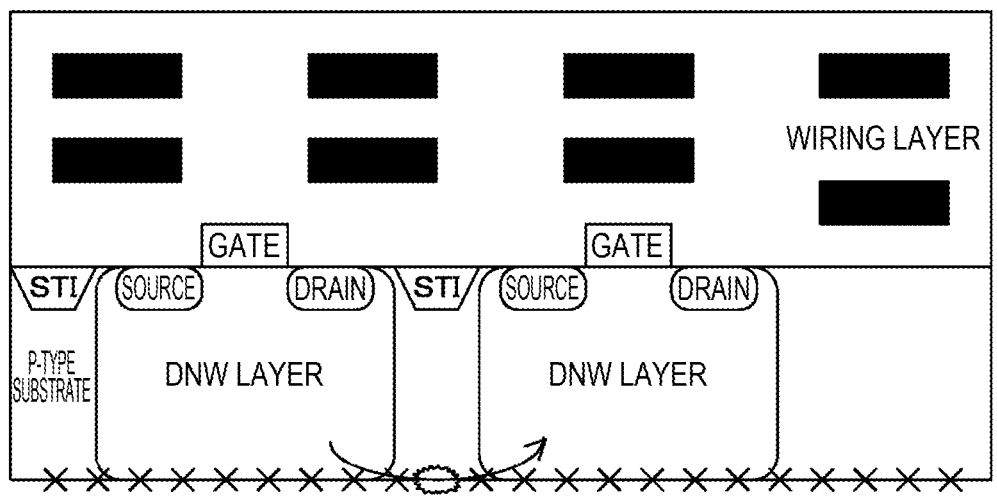
FIG. 4 is an example of a cross-sectional diagram of a solid-state image sensor according to a comparative example.

FIG. 4 is an example of a cross-sectional diagram of a solid-state image sensor according to a comparative example in which no P-well layers 220 and 221 are provided. The surface marked with "x" in the drawing indicates the surface polished before the insertion of the through-silicon via 222. A lattice defect may be caused on this surface due to the polishing. If there are no P-well layers 220 and 221, there is a likelihood of a leakage current flowing from one of the adjacent DNW layers to the other via the lattice defect.

On the other hand, in the solid-state image sensor 100 in which the P-well layers 220 and 221 are provided, a depletion layer is generated on the bonding surface of the P-well layer 220 and the DNW layer 218. Likewise, a depletion layer is also generated on the bonding surface of the P-well layer 221 and the DNW layer 219. Working as a barrier, the potentials of the depletion layers can prevent a leakage current from being generated.

As described above, since the P-well layers 220 and 221 are provided between the DNW layers 218 and 219 and the surface of the P-type substrate 225 on the light receiving side according to the first embodiment of the present technology, it is possible to cause depletion layers to be formed on the bonding surfaces of the DNW layers and the P-well layers. Due to the potential barrier of the depletion layers, a leakage current between the DNW layers 218 and 219 can be prevented.

Modified Example

Although the N-type MOS transistors are provided in the P-type substrate 225 in the above-described first embodiment, a P-type MOS transistor can be provided in an N-type substrate. A solid-state image sensor 100 according to a modified example of the first embodiment is different from that of the first embodiment in that a P-type MOS transistor is provided in an N-type substrate.

Figure 5:
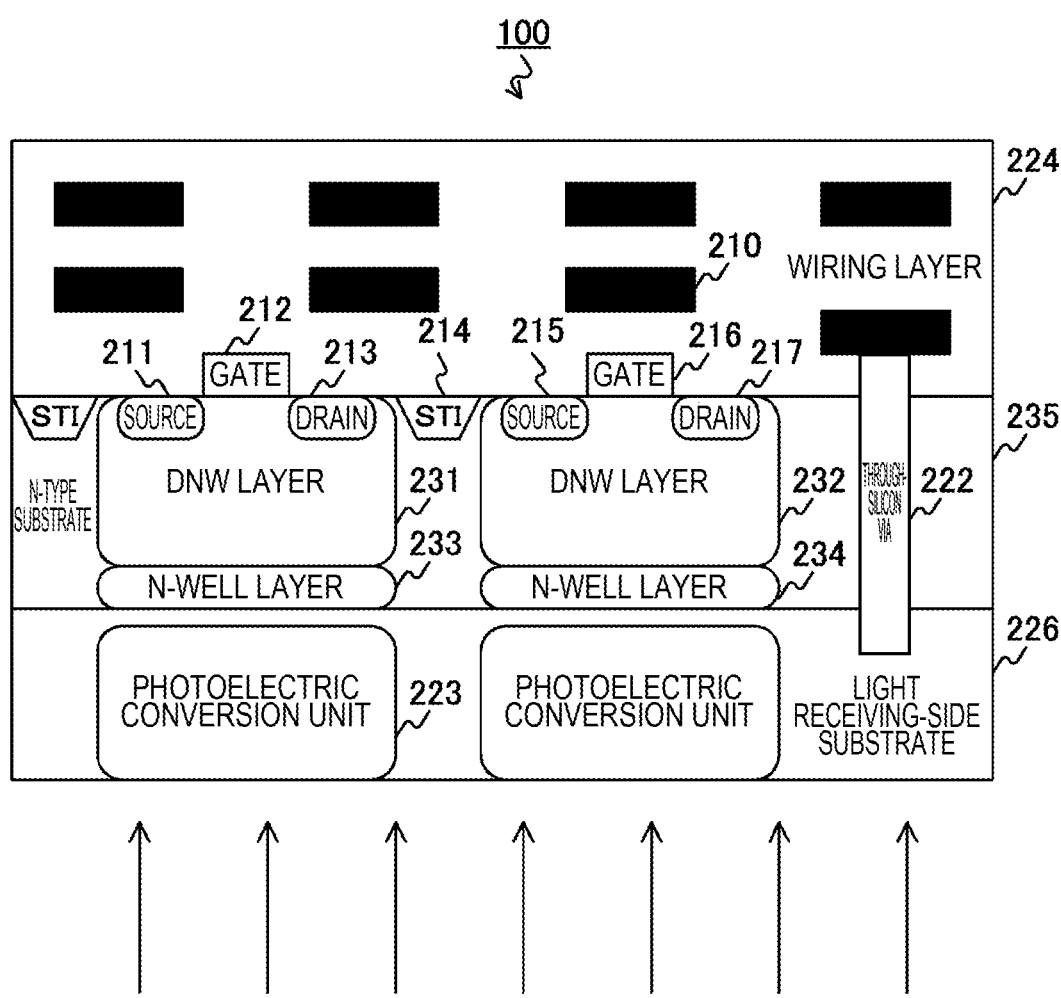
FIG. 5 is an example of a cross-sectional diagram of a solid-state image sensor according to a modified example of the first embodiment of the present technology.

FIG. 5 is an example of a cross-sectional diagram of a solid-state image sensor 100 according to a modified example of the first embodiment. An N-type substrate 235 is provided in the solid-state image sensor 100 according to the modified example of the first embodiment, instead of the P-type substrate 225. In addition, deep P-well (DPW) layers 231 and 232 are formed in the N-type substrate 235, instead of the DNW layers 218 and 219. In addition, N-well layers 233 and 234 are formed, instead of the P-well layers 220 and 221.

According to the modified example of the first embodiment of the present technology, since the N-well layers 233 and 234 are provided between the DPW layers 231 and 232 and the surface of the N-type substrate 235 on the light receiving side as described above, it is possible to cause depletion layers to be formed on the bonding surface of the DPW layers and the N-well layers. Due to the potential barrier of the depletion layers, a leakage current between the DPW layers 231 and 232 can be prevented.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

Note that the effects described in the present specification are not necessarily limited, and any effect described in the present disclosure may be exhibited.

Additionally, the present technology may also be configured as below.

(1)

A semiconductor integrated circuit including:

a silicon substrate into which one of P-type impurities and N-type impurities is implanted at a predetermined concentration;

a plurality of channels into which the other of the P-type impurities and the N-type impurities is implanted at a higher concentration than the predetermined concentration on one surface of the silicon substrate;

an electrode that is formed in each of the plurality of channels; and a well layer into which the same impurities as in the silicon substrate are implanted at a higher concentration than the predetermined concentration between the other surface of the silicon substrate and the plurality of channels.

(2)

The semiconductor integrated circuit according to (1), in which the P-type impurities are implanted into the silicon substrate, the N-type impurities are implanted into the plurality of channels, and the P-type impurities are implanted into the well layer.

(3)

The semiconductor integrated circuit according to (1), in which the N-type impurities are implanted into the silicon substrate, the P-type impurities are implanted into the plurality of channels, and the N-type impurities are implanted into the well layer.

(4)

The semiconductor integrated circuit according to any of (1) to (3), further includes:

a through-silicon via that penetrates the silicon substrate.

REFERENCE SIGNS LIST 100 solid-state image sensor
110 vertical drive circuit
120 pixel array unit
121 pixel
130 control circuit
140 column signal processing unit
141 signal processing circuit
150 horizontal drive circuit
160 output circuit
211, 215 source
212, 216 gate
213, 217 drain
214 STI
218, 219 DNW layer
220, 221 P-well layer
222 through-silicon via
223 photoelectric conversion unit
224 wiring layer
225 P-type substrate
226 light receiving-side substrate
231, 232 DPW layer
233, 234 N-well layer
235 N-type substrate

What is claimed is:

1. A semiconductor integrated circuit, comprising:

a silicon substrate into which one of P-type impurities and N-type impurities is implanted at a predetermined concentration;

a plurality of channels into which the other of the P-type impurities and the N-type impurities is implanted at a higher concentration than the predetermined concentration on a first surface of the silicon substrate;

an electrode that is formed in each of the plurality of channels;

a plurality of well layers into which the one of P-type impurities and N-type impurities as in the silicon substrate are implanted at a higher concentration than the predetermined concentration between a second surface of the silicon substrate and the plurality of channels; and an isolation region provided within the silicon substrate between adjacent channels of the plurality of channels in a non-overlapping manner with the adjacent channels, wherein the plurality of channels and the isolation region are provided within an area of the semiconductor integrated circuit having the one of P-type impurities and N-type impurities at the predetermined concentration.

2. The semiconductor integrated circuit according to claim 1,
wherein the P-type impurities are implanted into the silicon substrate,
the N-type impurities are implanted into the plurality of channels, and
the P-type impurities are implanted into the well layer.

3. The semiconductor integrated circuit according to claim 1,
wherein the N-type impurities are implanted into the silicon substrate,
the P-type impurities are implanted into the plurality of channels, and
the N-type impurities are implanted into the well layer.

4. The semiconductor integrated circuit according to claim 1, further comprising:
a through-silicon via that penetrates the silicon substrate.

5. The semiconductor integrated circuit according to claim 2, wherein the plurality of channels includes deep N-well (DNW) layers.

6. The semiconductor integrated circuit according to claim 3, wherein the plurality of channels includes deep P-well (DPW) layers.

7. A semiconductor integrated circuit, comprising:
a silicon substrate into which one of P-type impurities and N-type impurities is implanted at a predetermined concentration;
a plurality of channels into which the other of the P-type impurities and the N-type impurities is implanted at a higher concentration than the predetermined concentration on a first surface of the silicon substrate;
an electrode that is formed in each of the plurality of channels;
a plurality of well layers into which the one of P-type impurities and N-type impurities as in the silicon substrate are implanted at a higher concentration than the predetermined concentration between a second surface of the silicon substrate and the plurality of channels; and
an isolation region provided between adjacent channels of the plurality of channels,
wherein a first portion of the isolation region is provided on the first surface of the silicon substrate and a second portion of the isolation region directly overlaps with the silicon substrate in a region between the second portion of the isolation region and the second surface of the silicon substrate in a cross-sectional view,
wherein the plurality of channels and the isolation region are provided within an area of the semiconductor integrated circuit having the same impurities at the one of P-type impurities and N-type impurities at the predetermined concentration.

8. The semiconductor integrated circuit according to claim 7,
wherein the P-type impurities are implanted into the silicon substrate,
the N-type impurities are implanted into the plurality of channels, and
the P-type impurities are implanted into the well layer.

9. The semiconductor integrated circuit according to claim 7,
wherein the N-type impurities are implanted into the silicon substrate,
the P-type impurities are implanted into the plurality of channels, and
the N-type impurities are implanted into the well layer.

10. The semiconductor integrated circuit according to claim 7, further comprising:
a through-silicon via that penetrates the silicon substrate.

* * * * *